United States Patent
Mazur et al.

[19]

[11] Patent Number: 6,052,653
[45] Date of Patent: *Apr. 18, 2000

[54] SPREADING RESISTANCE PROFILING SYSTEM

[75] Inventors: Robert G. Mazur, Sewickley Heights; Robert C. Stephenson, North Irwin; Mark J. Andy, Aliquippa; Catherine L. Hartford, Pittsburgh; John R. Rogers, Beaver Falls, all of Pa.

[73] Assignee: Solid State Measurements, Inc., Pittsburgh, Pa.

[*] Notice: This patent issued on a continued prosecution application filed under 37 CFR 1.53(d), and is subject to the twenty year patent term provisions of 35 U.S.C. 154(a)(2).

[21] Appl. No.: 08/890,775

[22] Filed: Jul. 11, 1997

[51] Int. Cl.[7] ................................................. G01R 27/00

[52] U.S. Cl. .............................. 702/57; 702/65; 702/117; 324/715; 324/757; 324/758; 324/765; 382/145

[58] Field of Search .................................. 702/57–59, 35, 702/36, 40, 63, 68, 81–84, 85, 91, 94, 95, 105, 117–121, 130–133, 135, 159, 168, 172, 183–185, 186, 42; 364/468.17, 468.24, 468.27, 468.28, 488–491, 528.37, 528.38; 324/715, 717–719, 724, 751–754, 756–759, 765; 250/306, 307; 438/14, 17, 52, 934; 382/144, 145, 151, 128; 414/816; 356/32

[56] References Cited

U.S. PATENT DOCUMENTS

| | | | |
|---|---|---|---|
| 3,628,137 | 12/1971 | Mazur | 324/717 |
| 4,845,552 | 7/1989 | Jaggi et al. | 382/128 |
| 4,966,520 | 10/1990 | Yokota et al. | 414/816 |
| 5,214,289 | 5/1993 | Cao et al. | 324/719 |
| 5,347,226 | 9/1994 | Bachmann et al. | 324/724 |
| 5,726,907 | 3/1998 | Davidson et al. | 702/42 |
| 5,757,193 | 5/1998 | Yu et al. | 324/753 |

OTHER PUBLICATIONS

1. Product Brochure –SSM 150 spreading resistance system (1989).
2. Mazur, "Dopant Profiles by the Spreading Resistance Technique," American Chemical Society Symposium on Materials Characterization in Microelectronics Processing (1984).
3. Schroder, "Semiconductor Material and Device Characterization," pp. 23–33 (1990).
4. Product Brochure –Semiconductor Assessment Services LTD.
5. Micro Photonics Inc. Web Page. 7 pages.
6. Solid State Measurements. Inc., "Application Notes and Technical Papers Index," 14 pp. (1991–92).
7. Albers et al., "A Collection of Computer Programs for Two–Probe Resistance (Spreading Resistance) and Four–Probe Resistance Calculations, RESPAC," U.S. Department of Commerce, NIST Special Publication 400–91, 139 pages (1993).
8. Mazur et al., "Spreading Resistance Profiling," Solid State Measurements, Inc. (1997).
9. Solid State Measurements, Inc., "SSM Applications Seminar on Electrical Characterization of Semiconductor Materials and Devices with Conventional and Advanced SRP and SRP2," (1996).
10. Solid State Measurements, Inc. "SRP2 Software System",.
11. SSM Technical Report –SRP2 Analysis of ULSI Structures, 11 pages (1991).

*Primary Examiner*—Hal Dodge Wachsman
*Attorney, Agent, or Firm*—Webb Ziesenheim Logsdon Orkin & Hanson, P.C.

[57] ABSTRACT

A system for automatic spreading resistance profiling of wafer specimens. The system comprises a positioning stage for positioning the specimens for contact by probe tips and alternately a probe conditioning fixture or a sample calibration fixture. The system further comprises a programmed computer for controlling the positioning stage to effect automatic specimen profiling, probe tip conditioning, and calibration.

14 Claims, 10 Drawing Sheets

SPREADING RESISTANCE PROFILING SYSTEM

BACKGROUND OF THE INVENTION

The spreading resistance technique is known for profiling a variety of silicon structures. In this technique, a cross section of the structure (usually a small segment of a wafer) is exposed by beveling at an angle to the wafer surface. With a pair of point contacts, the spreading resistance is measured at regular intervals along the exposed surface to obtain the spreading resistance profile. Experimental details have been set forth in standardized test methods: ASTM F672-88, Standard Test Method for Measuring Resistivity Profiles Perpendicular to the Surface of a Silicon Wafer Using a Spreading Resistance Probe; ASTM F723-88, Standard Practice for Conversion Between Resistivity and Dopant Density for Boron-Doped and Phosphorous-Doped Silicon; and ASTM F674-92, Standard Practice for Preparing Silicon for Spreading Resistance Measurements.

Currently, spreading resistance profile (SRP) measurements are made by first lapping or grinding a sample of semiconductor at a known small angle; mounting the sample on the measuring apparatus so that the original surface and lap surface are in known positions; aligning the sample with manual controls while looking through a microscope so that the position of the start of the beveled (lapped) surface is in a defined starting position and so that the edge of the bevel is perpendicular to the measuring direction; manually moving the sample to a fixed distance from the viewing position to a measuring position adjacent a pair of point contacts (probes); making a series of electrical resistance measurements in fixed increments (typically 1 to 5 microns apart) down the bevel; and analyzing the data of resistance versus distance along the bevel to measure resistivity, dopant density, carrier concentration or other parameters of interest as a function of depth in a semiconductor material.

Prior to making the measurements, the shape of the probe tip is prepared by setting the tip on a surface coated with diamond particles and manually moving the surface to grind away material on the probe tip and to shape the tip.

Finally, prior to making the measurements, the system is calibrated by measuring the resistivity of a sample of bulk material which has known resistivity throughout the sample and has a recently ground surface (to remove oxides) and repeating the measurement on 10 or more individual samples covering the range of interest.

Apparatus have been developed to carry out the spreading resistance technique with some degree of automation, stepping the stage and specimen beneath the point contacts (probes), raising and lowering the probes and logging data. See, for example, U.S. Pat. No. 3,628,137 issued Dec. 14, 1971 to Robert G. Mazur entitled "Apparatus for Automatically Determining Spreading Resistance, Resistivity and Impurity Concentration in Semiconductor Bodies". This patent, incorporated herein by reference, discloses an incremental advance of the specimen while the probes have been automatically raised away from the specimen.

Even with the automation of the stepping of the specimen stage and data logging in the conduct of spreading resistance measuring, the technique is tedious and subject to variable results. In other words, different laboratory technicians will not necessarily develop the same profiles for the same specimen due to experimental variations.

It is an object, according to this invention, to further automate the various specimen handling and aligning, calibration and probe tip configuration steps to eliminate the need for constant technician attendance and to increase the reproducibility of these steps. It is an advantage, according to this invention, that all the motions of the measuring apparatus including lifting and lowering probes and x-y-z-$\theta$ positioning of the stage can be controlled by a computer. It is a further advantage that the computer will store certain process recipes for preparing the probes, making measurements, and so forth in a highly repeatable manner. It is a still further advantage of this invention that the image of the samples acquired by video camera can be captured in the computer and displayed when necessary. It is a yet further advantage of this invention that the calibration fixture will mount multiple samples and may allow for surfaces of all of the samples to be prepared simultaneously without removing them from the fixture. It is a still further advantage of this invention that a probe conditioning fixture will have an angled shaping surface which may be rotated completely around the axis of the probe tip, multiple surfaces with different diameters of diamond, pads to clean the tip between conditioning steps, and probe qualification samples to check the performance of the probe.

SUMMARY OF THE INVENTION

Briefly, according to this invention, a system for automatic spreading resistance profiling of one or a plurality of wafer specimens that have been prepared with a beveled surface intersecting an original surface at an edge is provided. The system comprises a resistance measuring unit including positive and negative probe tips and means for measuring the electrical resistance there between, an x-y-z-$\theta$ positioning stage for positioning the specimens for contact by the probe tips, a specimen holder having means for mounting the holder to the positioning stage in a kinematically stable manner, a microscope for viewing the specimen, a video camera and frame grabber for digitizing the microscope image, and a programmed computer and computer monitor. The computer monitor is for displaying the digitized microscope image and/or displaying screens for controlling the system. The computer is programmed for controlling the x-y-z-$\theta$ stage, the probe tips and the resistance measurements.

Preferably, the system comprises means for marking two points upon the image displayed on the computer monitor on the edge between the beveled surface and the original surface to identify a reference line and direction perpendicular thereto for obtaining spreading resistance measurements. The computer is programmed to automatically control the x-y-z-$\theta$ stage to translate the specimen to the correct starting position for spreading resistance profiling.

More preferably, the computer is programmed to process the digitized image to identify the edge between the beveled surface and the original surface to automatically identify a reference line and direction perpendicular thereto for obtaining spreading resistance measurements. Thereafter, the x-y-z-$\theta$ stage is automatically translated to the correct starting position.

Preferably, the system comprises a specimen holder capable of holding a plurality of specimens on the positioning stage and the computer is programmed to, after the edge between the beveled surface and the original surface has been identified for each sample, automatically proceed to conduct spreading resistance profiling measurements on each sample, one after the other.

According to a preferred embodiment of this invention, a multiple sample mount will allow an operator to condition a number of samples (six, for example), indicate the edge of the beveled sample and the number of points to be measured and the spacing between points, then, at some later time, to make all of the measurements, one after the other (which might take 5 to 10 minutes each).

In another preferred embodiment of this invention, the vision system will allow the operator to simulate the positions at which measurements will be made (to avoid surface defects, for instance). The vision system may automatically focus the image and automatically find the bevel edge. Means for precisely measuring the bevel angle may be provided.

Preferably, the system comprises a probe conditioning fixture for placement upon the positioning stage in a kinematically stable manner and the computer is programmed for controlling probe conditioning by manipulating the x-y-z-θ positioning stage.

Preferably, the system comprises a calibration fixture for mounting on the positioning stage in a kinematically stable manner and the computer is programmed to conduct spreading resistance measurements on a plurality of standard specimens mounted on the fixture.

According to a preferred embodiment, the computer is programmed to permit positioning of a two-dimensional cursor perpendicular to the bevel edge on the image displayed on the computer monitor to identify the path over which the probe tip is stepped during automatic spreading resistance profiling, and the cursor contains adjustable indicia for indicating positions therealong defining where measurements should be made.

BRIEF DESCRIPTION OF THE DRAWINGS

Further features and other objects and advantages will become clear from the following detailed description with reference to the drawings in which:

FIG. 5b is a cross section of a probe shaper mounted on the probe conditioning fixture of FIG. 5a;

FIG. 5c is a detail section of a Gorey-Schneider grinder mounted on the probe conditioning fixture of FIG. 5a;

DESCRIPTION OF THE PREFERRED EMBODIMENTS

Figure 1:
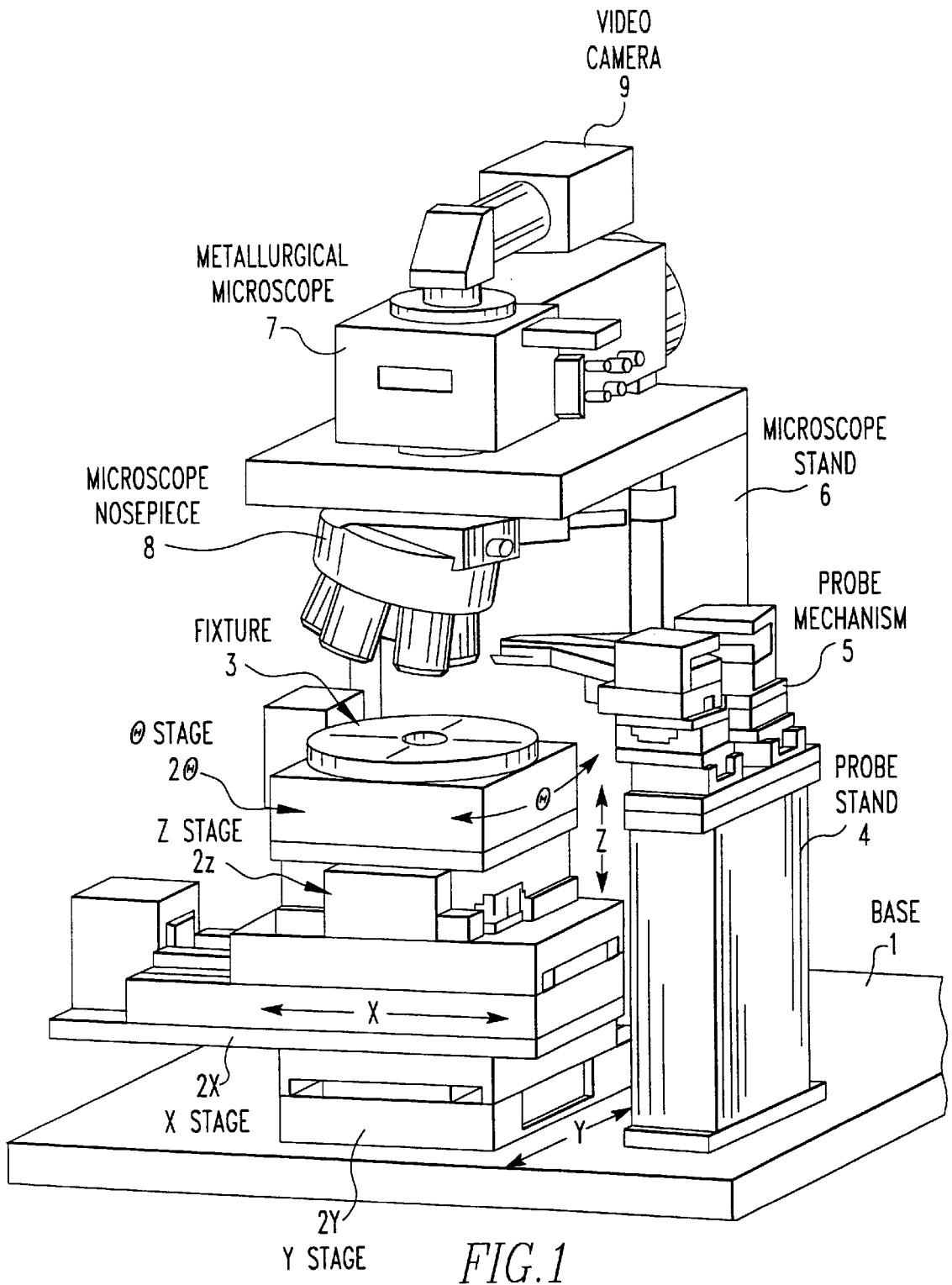
FIG. 1 is a perspective view of a measuring apparatus, according to this invention.

Referring to FIG. 1, the spreading resistance profiling apparatus, according to this invention, is shown in perspective. The machine rises from a base 1. Fastened to the base 1 is the x-y-z-θ stage 2 comprising individually operable y-stage 2y, x-stage 2x, z-stage 2z and θ-stage 2θ mounted one on top of the other. A fixture 3 is shown resting on the θ-stage. The fixture may be a sample holder, a calibration fixture or a probe conditioning fixture as explained hereafter. The manner in which each stage moves the fixture is indicated by arrows labeled x, y, z and θ.

Also fastened to the base 1 is a probe stand 4 on top of which is positioned the probe mechanism 5 for spreading resistance measuring. Still further, fastened to the base 1 is the microscope stand 6 on which is mounted a metallurgical microscope 7 with motorized objective lens nosepiece 8 and video camera 9. The x-y-z-θ stage 2 enables a beveled specimen to be placed under the probes and stepwise moved for spreading resistance measurements. The microscope 7 and video camera 9 enable the correct orientation of the specimen to be established, especially with reference to the edge between the beveled surface and the original surface.

Not shown in FIG. 1 are the motors which drive the x-y-z-θ stage 2. These motors may be stepper motors powered by a stepper motor driver or servo motors with a servo motor driver. For both types of motors, feedback may be required. Each stage may have associated therewith an encoder. If servo motors are used, all of the axes will have encoders. If stepper motors are used, the x and possibly the y axes will have encoders. The x axis will have a linear encoder. The y axis will use a rotary encoder. All encoders are wired to a four-axis controller 12. Mechanical or optical limit switches are provided for the x, y and z axes. When a switch is encountered, the switch closes. The limit switches are wired to the four-axis drive 12. As a result, motion will be stopped on the particular axis. The θ axis will not have a limit switch. The θ axis, however, will have a home switch. The four-axis drive 12 will use the inputs from the encoders, the limit switches, the home switch and commands from a low level controller 13 (to be described) to position the fixture.

Referring to FIG. 2, the overall system is illustrated. The x-y-z-θ position stage 10 (items 2x, 2y, 2z and 2θ in FIG. 1) are driven by the motors 11x, 11y, 11z and 11θ with encoder feedback in response to commands from the four-axis drive 12 and the low level controller 13. Brakes 24x and 24y are arranged to stop and hold the positions of the x-motor and y-motor.

The resistance measurement unit 14 comprises the probe mechanism 5 (see FIG. 1) driven by the probe controller (matrix switch) 15 in response to signals from the low level controller 13 and a resistance meter with a logarithmic output scale and a digital signal output. Probes may be controlled together. An alternative involves a single pneumatics control for two probe blocks. The pneumatics for probe control 18 have the following components. A lift air valve that allows air to flow into the chamber lifting the probes. This valve is normally open upon power up and a dump air valve which is open to let air from the chamber. This is to ensure the probes are all the way down. This valve will normally close upon power up. A leak valve is used to cause the probe to lower at a slow controlled rate. This valve will normally close upon power up. A probe block valve is closed when the probe protection blocks will be in place. Opening the valve will retract the blocks allowing control of the probes. If an air failure ever occurred, the blocks spring back into place to protect the probes. This valve will be normally closed upon power up.

The microscope 7 is controlled to focus in response to signals from the low level controller 13 via digital I/O controller 25. The motor for driving the motorized nosepiece 8 is controlled by five digital IO channels of the digital I/O controller 25. One is configured to turn the motor on and off. The other four channels are configured as input switches. Three of the switches detect what position the motorized nosepiece 8 is in. Upon power up, the switch and the motorized nosepiece 8 will be in the off position. An image illuminator 26 is also controlled by the digital I/O controller 25.

A joystick 16 for controlling the z and θ stages manually to bring the specimen into the field of view of the microscope 7 is connected to the low level controller 13. The joystick 16 is interfaced to the low level controller 13 by a serial port 23.

The low level controller 13 need only be a medium performance personal computer (PC). This controller 13 is responsible for controlling the various external devices, such as motors and relays. It accepts a wide variety of input signals used for measurement and feedback purposes. The operating system may be, for example, MS-DOS Version 6.22. It will contain the following control cards, for example: OMS PC-58E Four Axis Motion Controller; OPTO22 Mystic Remote Controller for interfacing with the probe unit and the motorized objective circuit; the National Instruments PCII-A GPIB Communications Card for communicating with the data gathering hardware of the probe unit; a Soundblaster 16 PNP Model SB-2929 game card 23 for interfacing with the joystick; and an industry standard high quality Ethernet card for interfacing with the high level controller 17. The low level controller 13 takes its instructions from the high level controller 17.

The low level controller 13 exists primarily to translate the high level controller's commands into physical action by the system hardware. As a result, most functions are initiated by the high level controller 17 and the low level controller's job is just to carry them out. In addition, the system will support calling of all functions via the console (keyboard 19, mouse 20 and monitor 21) to allow easy maintenance. During normal usage, the low level controller 13 is commanded via a TCP/IP socket interface to the high level controller 17. For maintenance and debugging purposes, the system will also be able to operate via a console (not shown and not normally present). The following table contains a list of some of the principal software programming functions implemented by the low level controller software.

TABLE OF LOW LEVEL COMPUTER SOFTWARE FUNCTIONS

| FUNCTION NAME | PURPOSE |
| --- | --- |
| Move Stage (x-y-z-θ reference feedback) | Moves the stage to the commanded x-y-z-θ position-locked out during measurements, probes not up or joystick active. |
| Get Stage Position () | Return stage position. |
| Move Stage to Limit (Current) | Move Position to the Current Stage Position. |
| Joystick (state) | Enables joystick control. Joystick controls stage motion until another joystick command. |
| Get Joystick Status () | Returns Current State of Joystick Axes and Buttons |
| Get Motor Parameters () | Returns step size, travel direction, max. speed, presence of encoder and encoder step. |
| Calibrate Resistance (source) | Calibrates the resistance meter. |
| Run Measurements (step list) | Measure series of points. It will be formatted to include the following information: number of points, distance to move per point on the x-axis, distance to move per point on the y-axis. |
| Moves Probes (move) | Moves probe up or down. |

Taking a measurement (implemented by the Run Measurements software function) consists of dropping the probes onto the sample (including waiting until the probes have settled on the sample), commanding the resistance meter 18 to take a measurement, storing the returned measurement value, storing the current stage position, and sending the measurement value and stage position back to the initiator of the measurement.

The high level controller 17 must comprise a high performance personal computer such as one having a Pentium 166 MHZ processor. This high level controller 17 is responsible for interfacing with the user as well as all data processing and control of the low level system. The high level controller 17 has a video frame grabber 22 that is used to display images taken from the camera mounted on the microscope 7. The high level controller 17 is provided with four high level computer program applications, namely, the Measurement Application; the Microscope Application; the Analysis Application; and the Gateway Application.

The computer program applications are comprised of a plurality of software functions or subroutines that are called or invoked as needed to complete the overall task charged to each application. The following tables identify useful software functions used in the Measurement and Microscope Applications.

TABLE OF IMPORTANT MICROSCOPE APPLICATION FUNCTIONS

| FUNCTION NAME | PURPOSE |
| --- | --- |
| Startup () | Initializes Microscope Application. |
| Focus () | Autofocus on the Specimen. |
| Objective Control (objective) | Selects objective lens. |
| Align Sample (edge) | 1) Aligns bevel edge parallel to probe tips or 2) aligns measurement axis parallel to existing probe marks. |
| Select Probing Points (contact radius, spacing, # of step sizes, step list) | Choose where to probe specimen for measurement. |
| Manual Stage Control () | For direct control of axis of travel. |
| Switch to Measurement () | Pass control of Measurement Application. |

| TABLE OF IMPORTANT MEASUREMENT APPLICATION FUNCTIONS | |
|---|---|
| FUNCTION NAME | PURPOSE |
| Startup () | Initialize System. |
| Switch to Microscope () | Transfers control to Microscope Application. |
| Switch to Analysis () | Transfers control to Analysis Application. |
| Load/Unload Sample () | To load new sample fixture. |
| Calibrate Resistance Meter () | Calibrate resistance meter. |
| Run a Measurement () | Setup and perform measurements. |
| Perform Calibration () | Setup and perform calibration measurements. |
| Perform Conditioning () | Perform conditioning operation on probe. |
| Define Recipe | Modify/create measurements/processing recipes. |

The Measurement Application is responsible for sample loading/unloading operations, not including sample alignment, such as bevel edge alignment, focusing, etc.; prompting input of initial sample information from the user (sample name, recipe, etc.); running normal measurements, generating a measurement file for use by the Analysis Application; running calibration measurements, generating/modifying the calibration file; and performing probe setup operations including probe conditioning, probe settling and probe information entry. The Measurement Measurement Application (though they may be run independently if desired).

The Microscope Application is responsible for sample alignment, including focusing, bevel edge alignment and probe location; probe mark examinations including measurement between two points on the microscope image; general microscope control including objective switching, lighting, controls, etc.; manual stage motion supporting a mouse and keyboard input; and frame grabber control. The Microscope Application depends upon the Measurement Application to supply parameters that detail the step size and the number of points to be run. This information is used to display a graphical overlay of the projected probing marks onto the frame grabber image. This overlay allows the user to see where a measurement run will take place, making it easier to avoid sample imperfections.

The Gateway Application which is normally transparent to the user and has no user interface is responsible for passing information back and forth between the high level controller 17 and the low level controller 13 and in passing information between applications. The Analysis Application is responsible for spreading resistance profile data processing.

Figure 3:
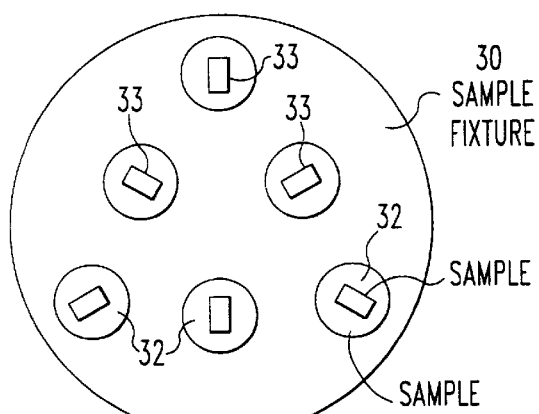
FIG. 3 is a top view of a multiple sample fixture, according to this invention.

Referring to FIG. 3, a multiple sample fixture 30 is schematically illustrated. The fixture consists of a metal disk 31, for example, about 3½ inches in diameter with a kinematic mount on the bottom so that it can be removed and replaced from the positioning stage quickly and accurately. The fixture 30 illustrated holds six samples 33 on a, for example, 0.890 inch diameter sample mount 32. Each sample has its own kinematic mount 32. This allows the operator to separate the tasks of aligning the sample from the task of making a measurement.

Figure 4:
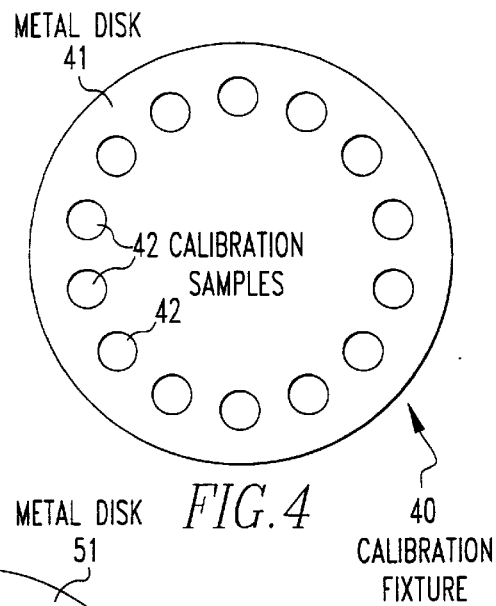
FIG. 4 is a top view of a calibration fixture, according to this invention.

Referring to FIG. 4, a calibration fixture 40 is illustrated. This fixture consists of a metal disk 41, for example, 3½ inches in diameter with a kinematic mount on the bottom so that it can be removed and replaced in exactly the same position on the stage. The disk holds 10 to 20 individual calibration samples 42 on approximately ⅜ inch diameter mounts. The sample mounts have individual height adjustments so that once the sample heights are adjusted, all samples can have their top surfaces lapped at the same time.

Figure 5A:
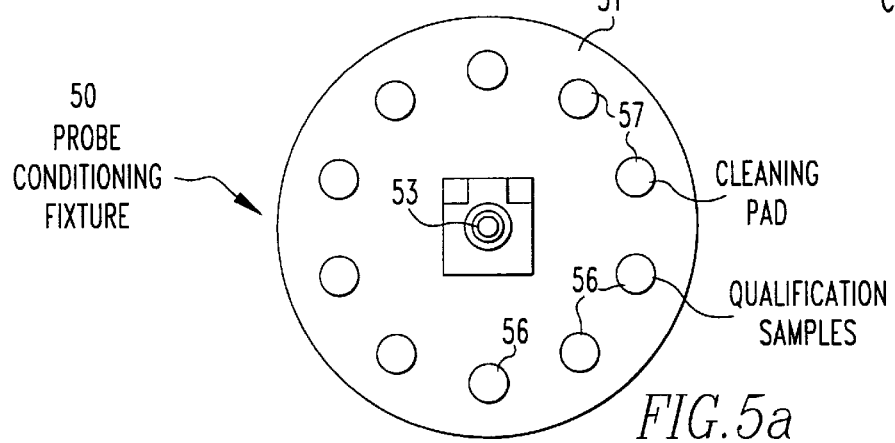
FIG. 5a is a top view of a probe conditioning fixture.

Referring now to FIG. 5a, there is illustrated a probe conditioning fixture 50. This fixture consists of a metal disk 51, for example, 3½ inches in diameter, with a kinematic mount. Devices to shape the probe tip 52 with diamond compound, clean the tip and make electrical qualifications are provided. Also mounted upon the probe conditioning fixture 50 are qualification samples 56 and cleaning pads 57.

Figure 5B:
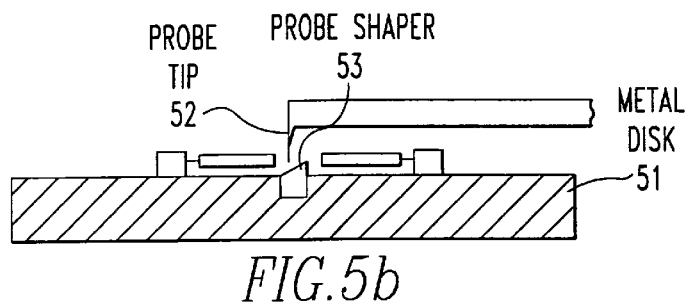

FIG. 5b illustrates a probe shaper 53 for shaping the surface. The shaping surface is shown at an exaggerated angle, typically 8°. The probe tip 52 is positioned on center and the plate rotated to shape the probe tip 52.

Figure 5C:
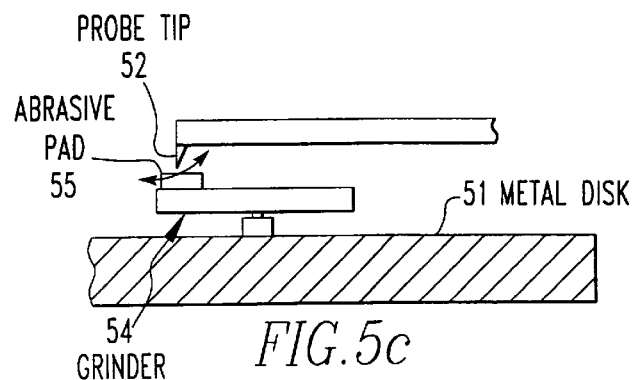

FIG. 5c illustrates a Gorey-Schneider grinder 54 mounted to the probe conditioning fixture 50. Lowering the probe tip on the fixture 50 causes a pad 55 with abrasive compound to rock on a pivot across the probe tip 52, thus configuring the probe tip. The fixture 50 can be rotated and the process repeated.

Figure 6A:
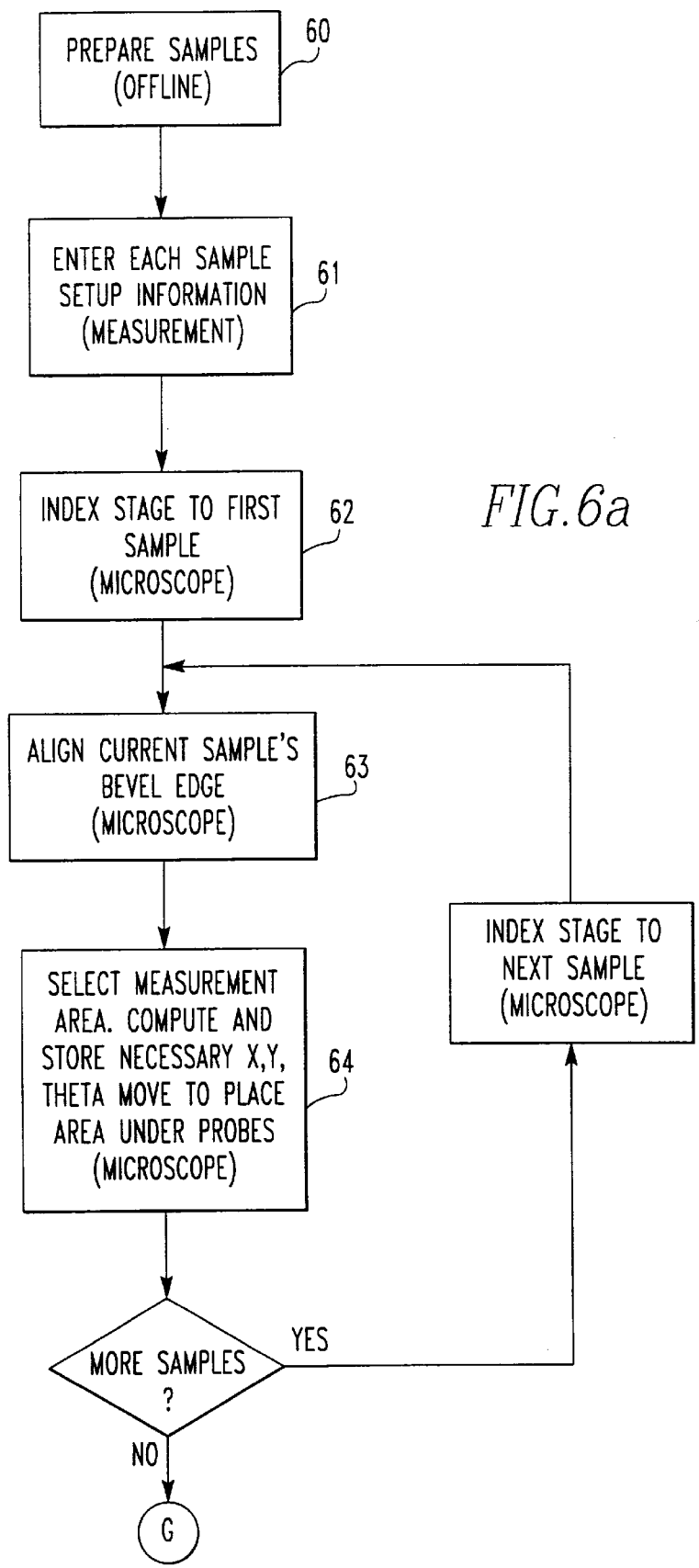
FIGS. 6a and 6b are flow diagrams illustrating normal measurement procedures implemented both off-line and by programmed computer.
Figure 6B:
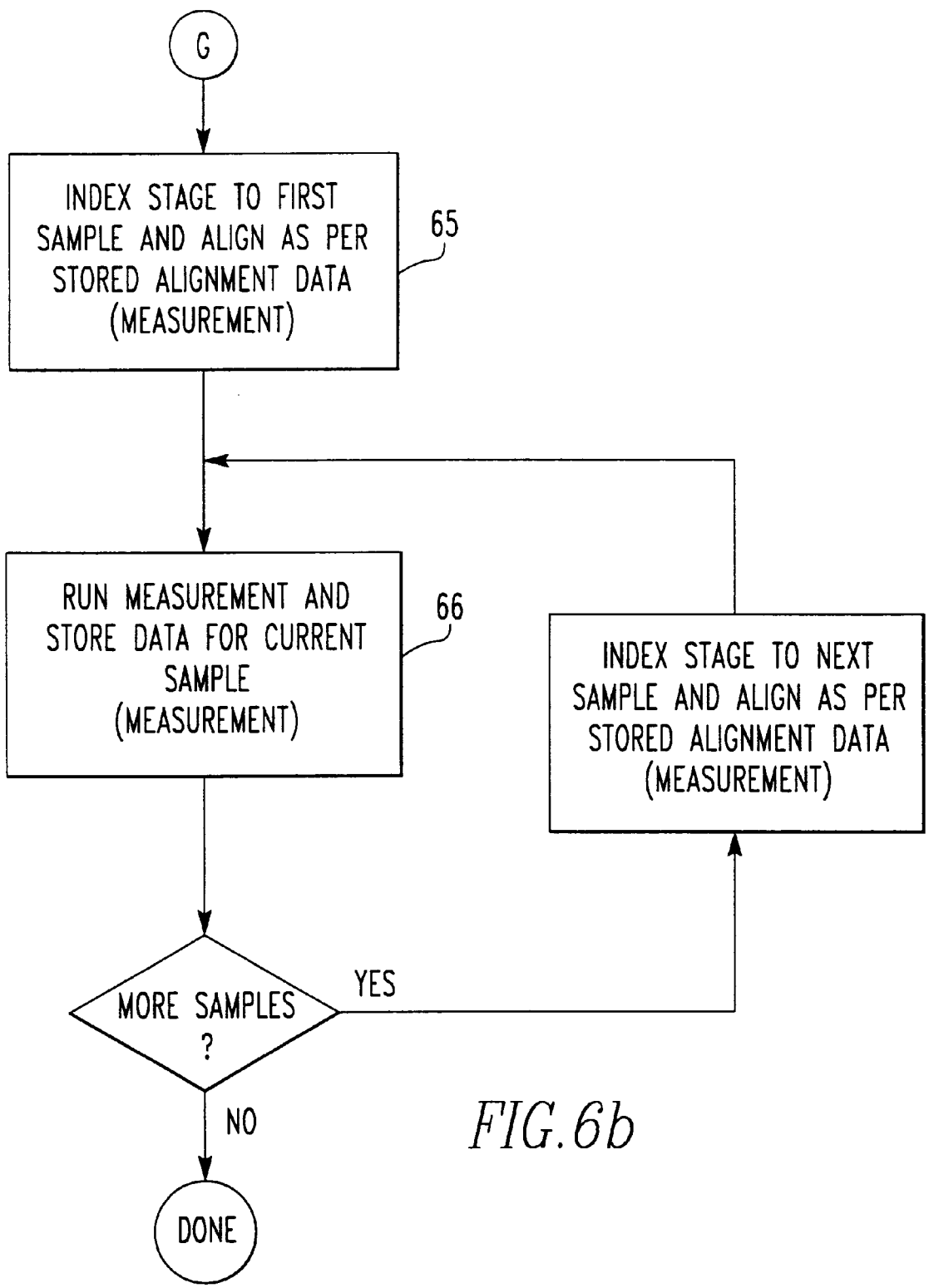

FIGS. 6a and 6b are flow diagrams illustrating the normal measurement process. The normal measurement process passes control back and forth between the Measurement Application, the Microscope Application and finally passes control to the Analysis Application.

The Measurement Application is the user's entry point into the spreading resistance profiling software system. On startup, the user is prompted to load a sample at 60. The user is then prompted to enter sample information at 61. After the sample information is entered, the Microscope Application is launched automatically. The sample is loaded and positioned under the microscope at 63. Sample information entered at 61 includes bevel angle and step length, measurement depth, probe load, probe spacing and contact radius, sample finish and orientation, measurement polarity, north probe ID, and south probe ID, for example.

Preferably, on launching of the Microscope Application, the sample is automatically brought into focus and the bevel edge is automatically found and the user is prompted to confirm that the found edge is actually the bevel edge at 63. Otherwise, focus and bevel edge alignment are manually performed. After confirmation, the bevel edge is aligned perpendicular to the measurement direction of travel. The user then drags a set of graphical probe marks overlaid on a sample image to the probing location at 64. Once the user is satisfied that the probing location is correct, control is returned to the Measurement Application 65. The resistant measurement starts with the user being shown measurement results as they become available at 65, 66. After the measurement is completed, the user is prompted to determine if they would like to run more points, reexamine the sample by the Microscope Application, unload the sample and save the measurement file or some other operation 67.

After the user is satisfied with measurement data, a measurement file is generated and the Analysis Application is launched with the measurement file name supplied.

In the Analysis Application, the measurement file is manipulated to clean up the resistance data with point editing and/or smoothing functions. Resistivity and carrier concentration profiles are generated from established resistance data. The measurement file may be saved or the user may choose to generate a report showing data profiles and detailing sample information.

Figure 7A:
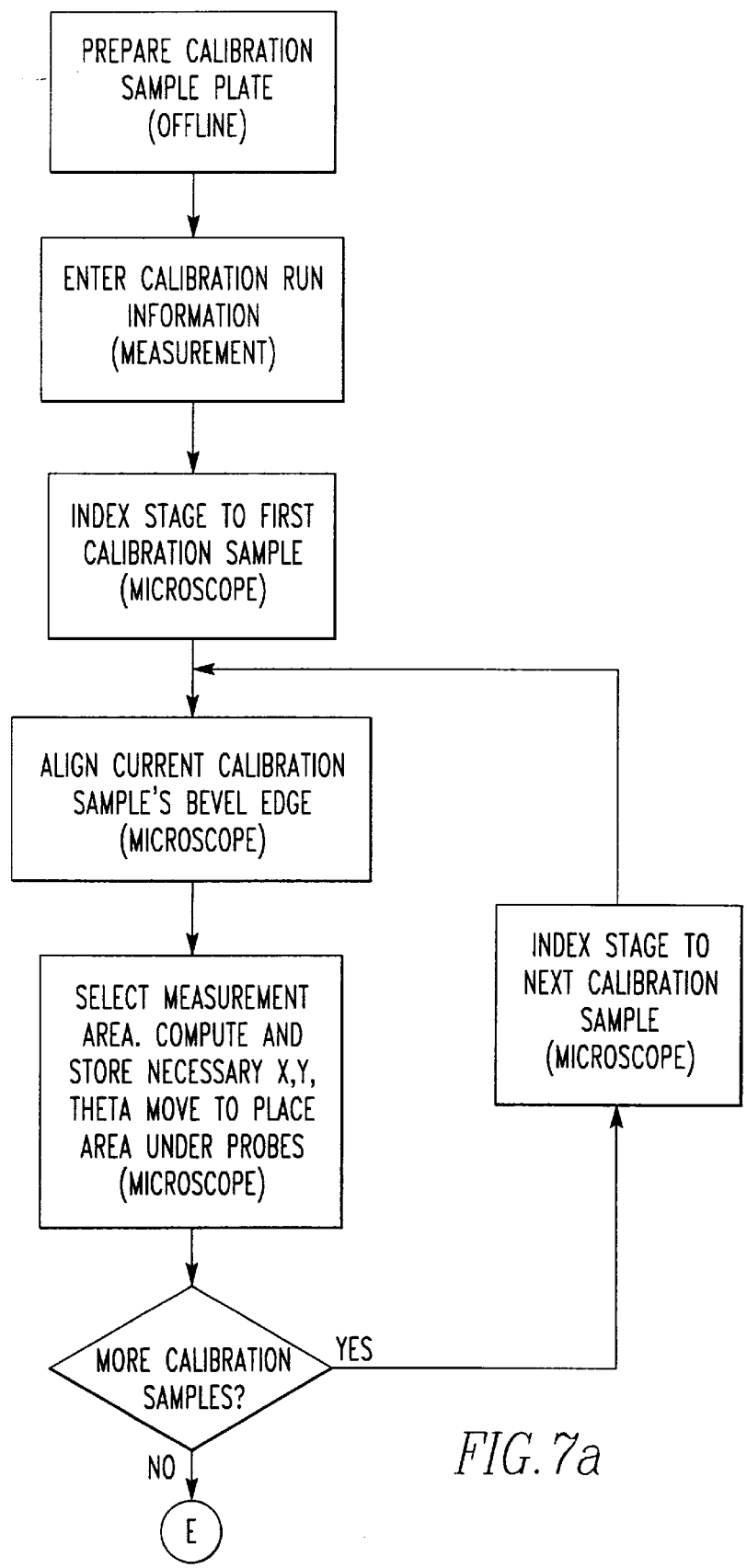
FIGS. 7a and 7b are flow diagrams illustrating calibration measurement procedures implemented both off-line and by programmed computer.
Figure 7B:
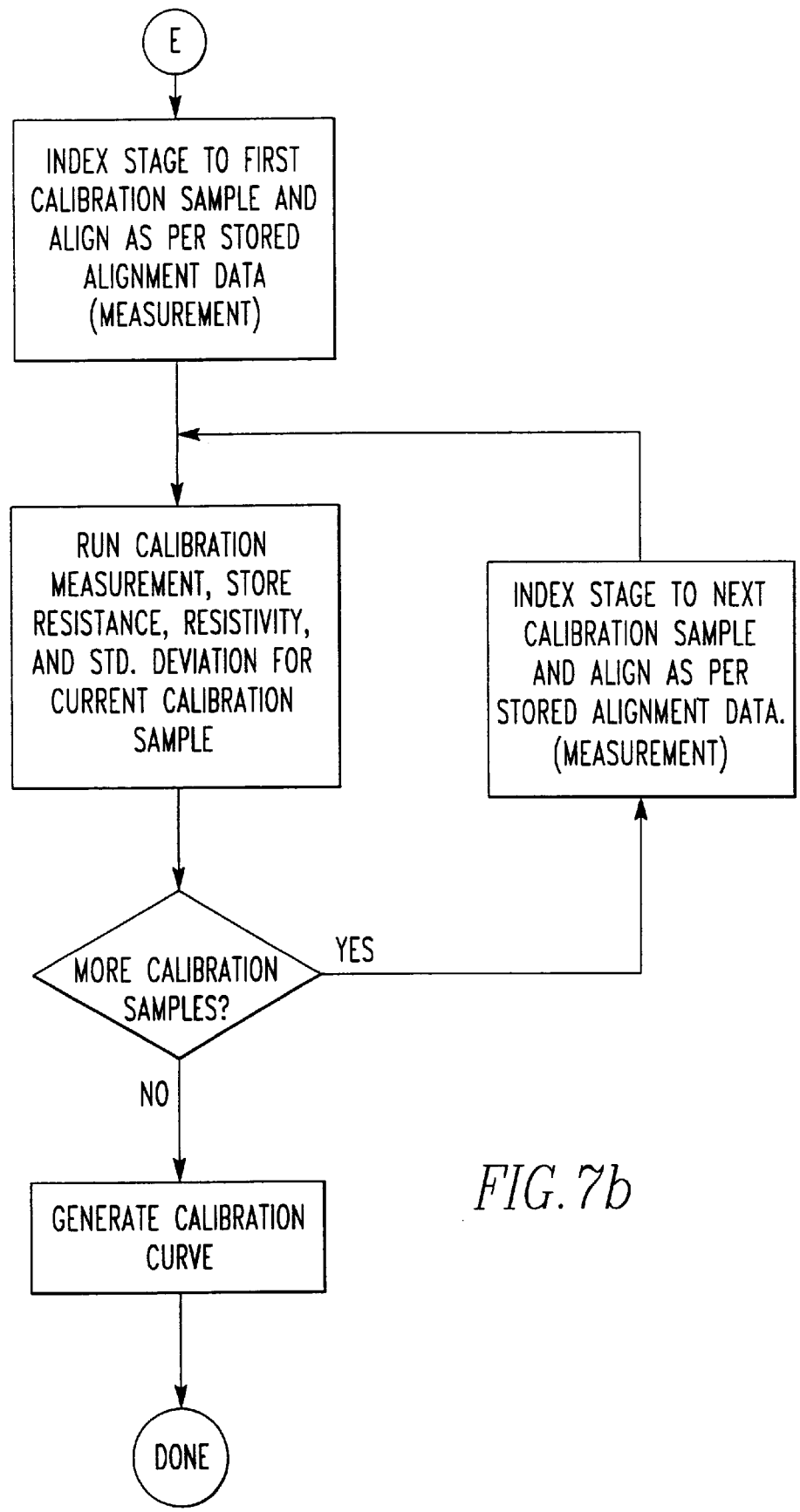

Referring to FIGS. 7a and 7b, there is shown the calibration measurement process. The calibration measurement process passes control back and forth between the Measurement Application and the Microscope Application. On startup, the user will be prompted to load a sample at 71 and 72. The user then chooses not to load a new sample and switches to the calibration mode. The user chooses to run a new calibration measurement and enters the calibration parameters 71. A calibration measurement is designed to generate a calibration curve (resistance versus resistivity) for a given conductivity type, orientation, surface finish, step size, probe load, probe spacing, measurement polarity and probe contact radius. The calibration process uses multiple individual samples with known resistivity and measures their resistance. These data points are then used to interpolate a resistivity given a resistance value by the data processing functions. The system then prompts the first sample to be loaded, loads it and transfers to the Microscope Application at 71 and 72. The Microscope Application aligns the sample 73 and the user selects the probing location as in a normal measurement. Thereafter, control is transferred back to the Measurement Application 74. Measurement points are run 75. The average resistance value and reference resistivity are stored. The user is prompted to insert the next calibration sample and/or the next calibration sample is automatically moved into place by the Microscope Application 76. The sample is loaded and processed as above and the process repeats until all samples in the series have been run. Finally, a calibration curve is generated and stored in the calibration file.

Figure 8A:
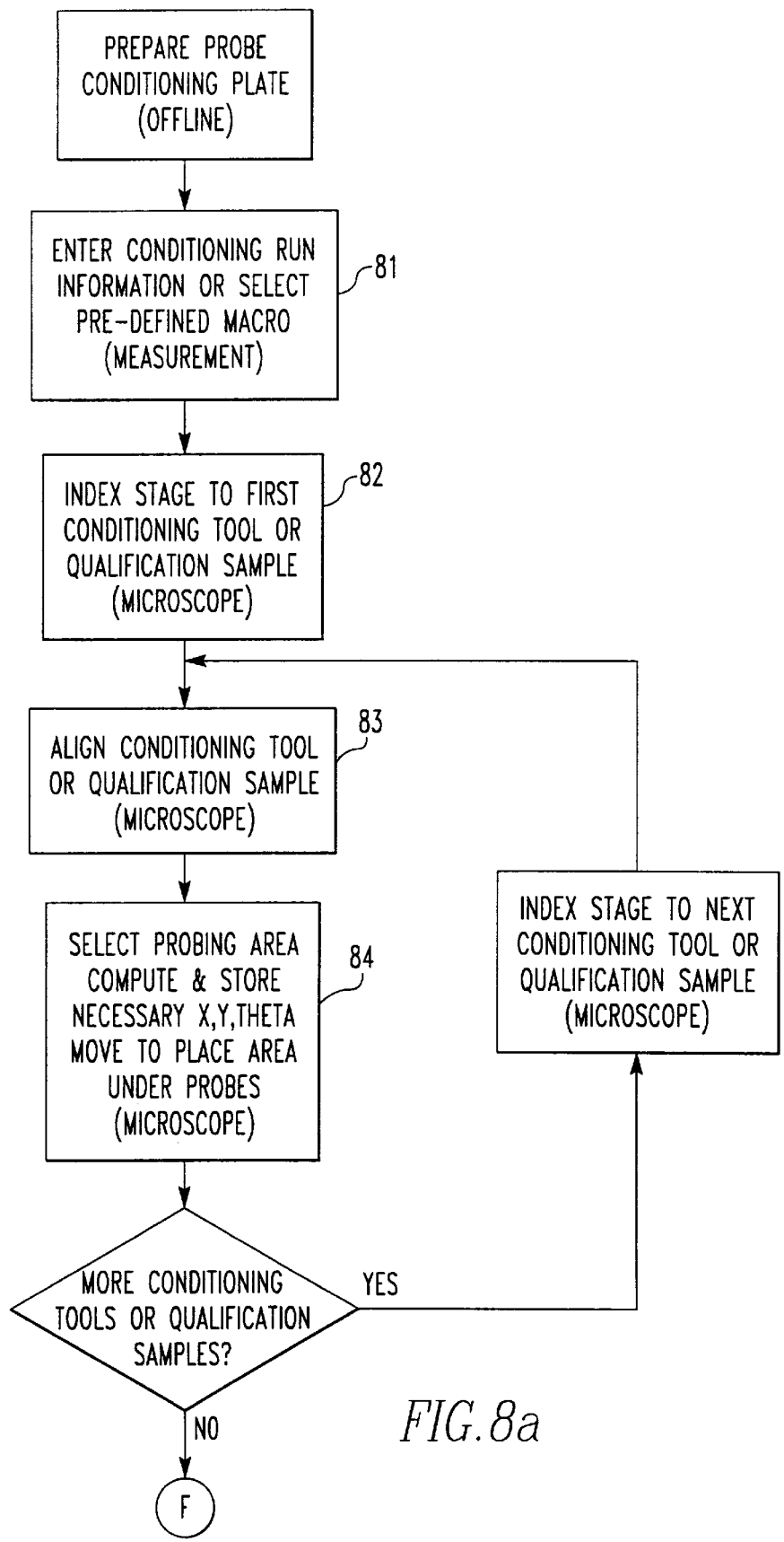
FIGS. 8a and 8b are flow diagrams illustrating probe conditioning procedures implemented both off-line and by programmed computer.
Figure 8B:
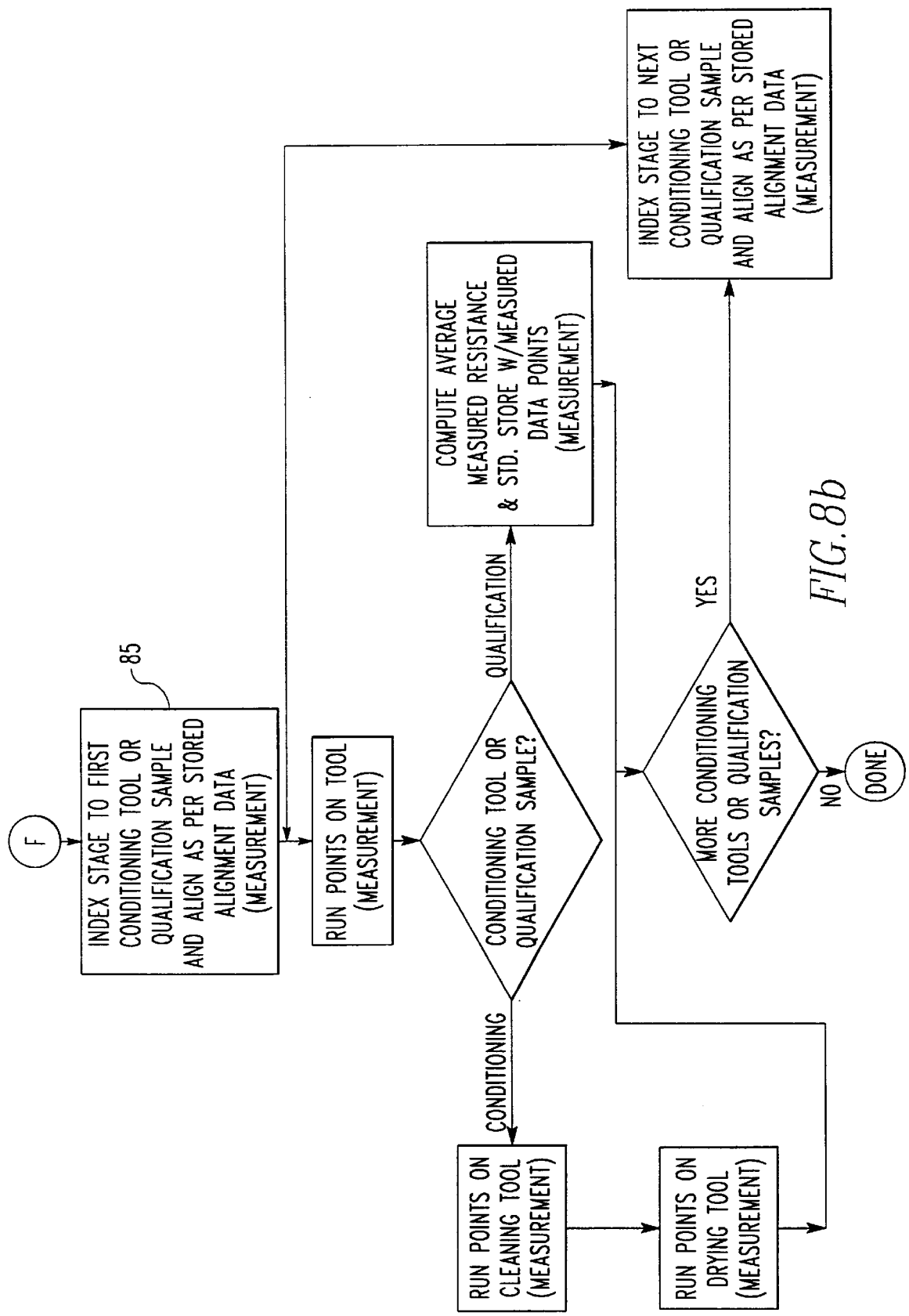

Referring to FIGS. 8a and 8b, there is shown a flow diagram for the probe conditioning process. The probe conditioning process passes control back and forth between the Measurement Application and the Microscope Application. On startup, the user will be prompted to load a sample. The user chooses not to load a new sample and switches to the probe setup mode. The user chooses to perform probe conditioning on a probe. That probe's history file is opened and the user is allowed to either use a conditioning tool or run qualification sample measurements. Either way, the appropriate tool/sample is loaded and control transfers to the Microscope Application 81, 82. The sample is aligned 83 and the user selects the probe location as in a normal measurement for qualification samples 84. If a conditioning tool was selected, the user positions the tool as required and control is transferred back to the Measurement Application. The selected run, sample or tool is run and the tests are displayed to the user and stored in the probe history file 85. If a qualification sample has been run, the user is given the option to transfer to the Microscope Application to view the probe marks.

In the normal measurement process, the calibration measurement process or the probe conditioning process, the microscope is used to display an image via the camera attached to the microscope feeding the image to the system. The two modes are supported here. The first, when the user is using the eyepiece, relies on the user to perform and confirm that the alignment operations are complete. The second, when an image is supplied via the camera to the system, simplifies the alignment and confirmation processes for the user as much as possible. Under normal conditions, the camera will be used. For sample alignment, the sample must be at an appropriate height relative to the probes. This can be accomplished by getting the sample into focus. The depth of field on the focus of the microscope is small enough so that no significant errors are introduced. The sample bevel edge must be perpendicular to the axis of measurement travel. This can be assisted in the camera mode by either having the system automatically detect the bevel edge or, if this is not possible, by having the user use graphical controls to indicate the bevel edge. The sample can then be rotated until the bevel edge alignment is appropriate. The user needs to be able to measure distance along the plane of the sample.

Having thus described our invention with the detail and particularity required by the Patent Laws, what is desired protected by Letters Patent is set forth in the following claims.

What is claimed is:

1. A system for automatic spreading resistance profiling of one or a plurality of wafer specimens that have been prepared with a beveled surface and original surface intersecting at an edge comprising:

a resistance measuring unit including positive and negative voltage probe tips supported by kinematic probe arms for lowering the probe tips onto the specimens without any lateral motion and means for measuring the electrical resistance between the probe tips;

an x-y-z-θ positioning stage for positioning said specimens for contact by the probe tips;

a specimen holder having means for mounting the holder to the positioning stage in a kinematically stable manner;

a microscope;

a video camera and frame grabber for digitizing the microscope image; and a programmed computer and computer monitor for displaying the digitized microscope image, the computer being programmed to (a) automatically control the x-y-z-θ stage to translate the specimen to the correct starting position for spreading resistance profiling based upon the image displayed on the monitor, (b) automatically control the x-y-z-θ stage, the probe tips and resistance measurement circuit.

2. A system according to claim 1, further comprising means for marking two points upon the image displayed on the computer monitor on the edge between the beveled surface and the original surface to identify a reference line and direction perpendicular thereto for obtaining spreading resistance measurements.

3. A system according to claim 2, wherein the computer is programmed to automatically control the x-y-z-θ stage to translate the specimen to the correct starting position for spreading resistance profiling based upon the placement of the two points marked upon the image displayed on the monitor.

4. A system according to claim 1, further comprising said specimen holder capable of holding a plurality of specimens on the positioning stage and said computer programmed to, after the edge between the beveled surface and the original surface has been identified for each sample, automatically proceeding to conduct spreading resistance profiling measurements on each sample one after the other.

5. The system according to claim 1, further comprising said computer programmed to process the digitized image to identify the edge between the beveled surface and the original surface to identify a reference line and direction perpendicular thereto for obtaining spreading resistance measurements.

6. A system according to claim 5, wherein the computer is programmed to automatically control the x-y-z-θ stage to translate the specimen to the correct starting position for spreading resistance profiling based upon the placement of the reference line upon the image displayed on the monitor.

7. A system for automatic spreading resistance profiling of one or a plurality of wafer specimens that have been prepared with a beveled surface and original surface intersecting at an edge comprising:

a resistance measuring unit including positive and negative voltage probe tips supported by kinematic probe arms for lowering the probe tips onto the specimens without any lateral motion and means for measuring the electrical resistance between the probe tips;

an x-y-z-θ positioning stage for positioning said specimens for contact by the probe tips;

a specimen holder having means for mounting the holder to the positioning stage in a kinematically stable manner;

a microscope;

a video camera and frame grabber for digitizing the microscope image;

a programmed computer and computer monitor for displaying the digitized microscope image, the computer being programmed to (a) automatically control the x-y-z-θ stage to translate the specimen to the correct starting position for spreading resistance profiling based upon the image displayed on the monitor, (b) automatically control the x-y-z-θ stage, the probe tips and resistance measurement circuit; and a probe conditioning fixture for conditioning the probe tips by contacting the tips to one or more moving surfaces coated with different diameter diamond particles so as to control the texture of the probe tip, said fixture being placed upon the positioning stage in a kinematically stable manner and said computer programmed for controlling probe conditioning by manipulation of the x-y-z-θ positioning stage.

8. The system according to claim 7, wherein the probe conditioning fixture further comprises cleaning pads and qualifying specimens mounted thereon and the computer is further programmed for interactive conditioning, cleaning, and qualifying of probe tips.

9. A system for automatic spreading resistance profiling of one or a plurality of wafer specimens that have been prepared with a beveled surface and original surface intersecting at an edge comprising:

a resistance measuring unit including positive and negative voltage probe tips supported by kinematic probe arms for lowering the probe tips onto the specimens without any lateral motion and means for measuring the electrical resistance between the probe tips;

an x-y-z-θ positioning stage for positioning said specimens for contact by the probe tips;

a specimen holder having means for mounting the holder to the positioning stage in a kinematically stable manner;

a microscope;

a video camera and frame grabber for digitizing the microscope image;

a programmed computer and computer monitor for displaying the digitized microscope image, the computer being programmed to (a) automatically control the x-y-z-θ stage to translate the specimen to the correct starting position for spreading resistance profiling based upon the image displayed on the monitor, (b) automatically control the x-y-z-θ stage, the probe tips and resistance measurement circuit; and further comprising a calibration fixture mounted on the positioning stage in a kinematically stable manner and said computer programmed to conduct spreding resistance measurements on a plurality of standard specimens mounted on said fixture.

10. The system according to claim 9, wherein said computer is further programmed to display calibration curves of measured spreading resistance values versus the resistivities of the plurality of standard specimens.

11. The system according to claim 9, further comprising said calibration fixture configured such that the surfaces of the standard specimens can be simultaneously machined.

12. A system for automatic spreading resistance profiling of one or a plurality of wafer specimens that have been prepared with a beveled surface and original surface intersecting at an edge comprising:

a resistance measuring unit including positive and negative voltage probe tips supported by kinematic probe arms for lowering the probe tips onto the specimens without any lateral motion and means for measuring the electrical resistance between the probe tips;

an x-y-z-θ positioning stage for positioning said specimens for contact by the probe tips;

a specimen holder having means for mounting the holder to the positioning stage in a kinematically stable manner;

a microscope;

a video camera and frame grabber for digitizing the microscope image;

a programmed computer and computer monitor for displaying the digitized microscope image, the computer being programmed to (a) automatically control the x-y-z-θ stage to translate the specimen to the correct starting position for spreading resistance profiling based upon the image displayed on the monitor, (b) automatically control the x-y-z-θ stage, the probe tips and resistance measurement circuit; and means for positioning a two-dimensional cursor perpendicular to the edge between the beveled surface and the original surface on the image displayed on the computer monitor to identify the path over which the probe tips are stepped during automatic spreading resistance profiling.

13. The system according to claim 12, in which the two-dimensional cursor displays indicia for indicating positions along the line where measurements will be made and means for adjusting the spacing of said indicia.

14. A system for automatic spreading resistance profiling of one or a plurality of wafer specimens that have been prepared with a beveled surface and original surface intersecting at an edge comprising:

a resistance measuring unit including positive and negative voltage probe tips supported by kinematic probe arms for lowering the probe tips onto the specimens without any lateral motion and means for measuring the electrical resistance between the probe tips;

an x-y-z-θ positioning stage for positioning said specimens for contact by the probe tips;

a specimen holder having means for mounting the holder to the positioning stage in a kinematically stable manner;

a microscope;

a video camera and frame grabber for digitizing the microscope image;

a programmed computer and computer monitor for displaying the digitized microscope image, the computer being programmed to (a) automatically control the x-y-z-θ stage to translate the specimen to the correct starting position for spreading resistance profiling based upon the image displayed on the monitor, (b) automatically control the x-y-z-θ stage, the probe tips and resistance measurement circuit; and comprising means for identifying upon the image displayed on the computer monitor the edge between the beveled surface and the original surface to identify a reference line and direction perpendicular thereto for obtaining spreading resistance measurements.

* * * * *

UNITED STATES PATENT AND TRADEMARK OFFICE
CERTIFICATE OF CORRECTION

PATENT NO.    : 6,052,653
DATED         : April 18, 2000
INVENTOR(S)   : Robert G. Mazur et al.

Figure 2A:
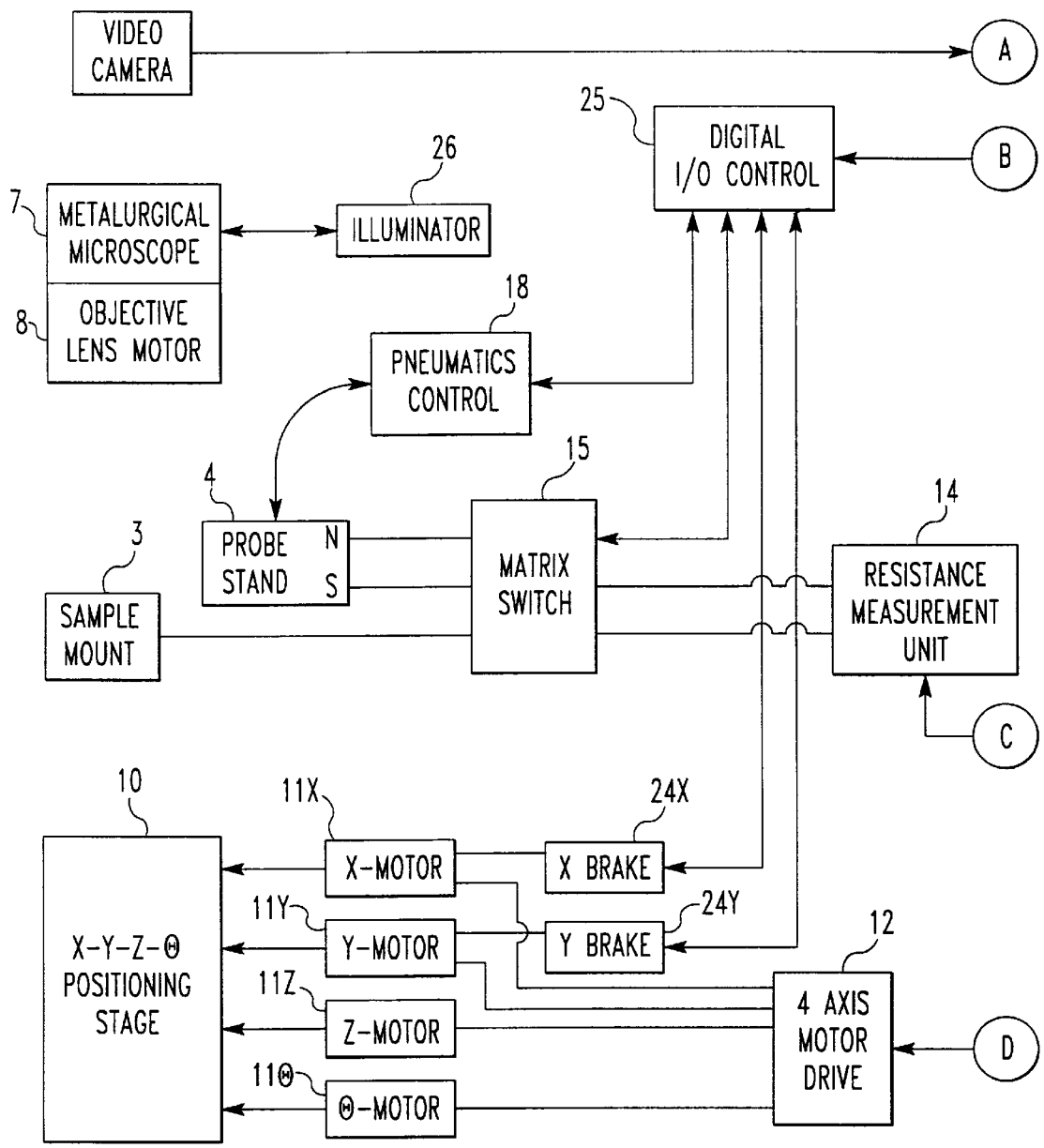
FIGS. 2a and 2b is a flow diagram illustrating the interconnection of the various hardware and computer program features of this invention.
Figure 2B:
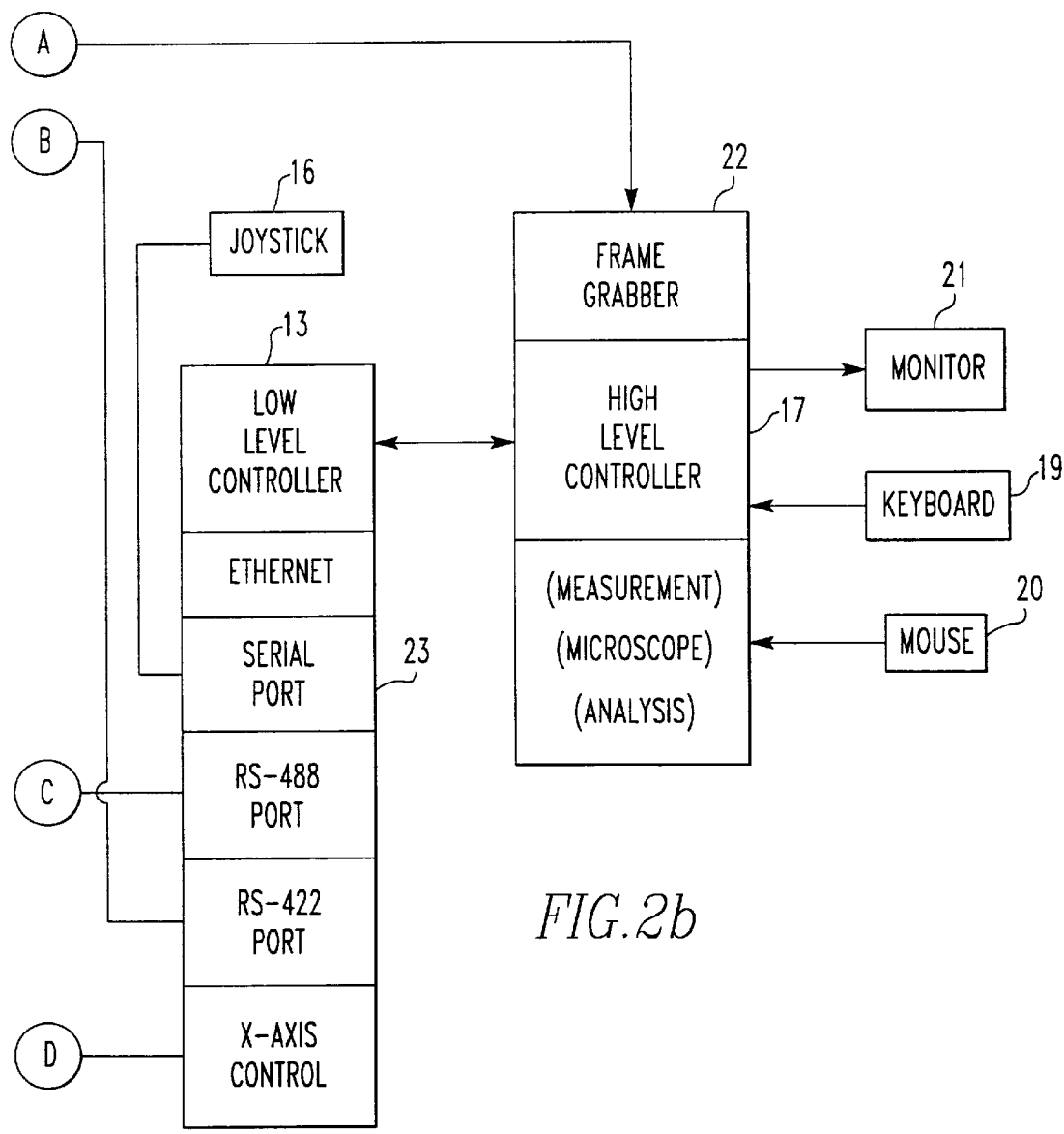

It is certified that error appears in the above-identified patent and that said Letters Patent is hereby corrected as shown below:

Column 3,
Line 38, "FIGS. 2a and 2b is" should read -- FIGS. 2a and 2b are --.

Column 4,
Line 37, "Fig. 2" should read -- Figs. 2a and 2b --.

Column 7,
Line 33, between "Measurement" and "Measurement" insert: -- acts as the front end to the software system. The Microscope and Analaysis Applications are slave to the --.

Column 10, claim 1,
Line 28, before "(b)" insert -- and --.
Line 30, "circuit." should read -- unit. --.

Column 11, claim 7,
Line 14, before "(b)" insert -- and --.
Line 16, "circuit;" should read -- unit; --.

Column 11, claim 9,
Line 51, before "(b)" insert -- and --.
Line 53, "circuit;" should read -- unit; --.
Line 56, "spreding" should read -- spreading --.
Line 57, "measuraments" should read -- measurements --.

UNITED STATES PATENT AND TRADEMARK OFFICE
CERTIFICATE OF CORRECTION

PATENT NO. : 6,052,653
DATED : April 18, 2000
INVENTOR(S) : Robert G. Mazur et al.

It is certified that error appears in the above-identified patent and that said Letters Patent is hereby corrected as shown below:

Column 12 , claim 12,
Line 22, before "(b)" insert -- and --.
Line 24, "circuit;" should read -- unit; --.

Column 12, claim 14,
Line 58, before "(b)" insert -- and --.
Line 60, "circuit;" should read -- unit; --.

Signed and Sealed this

Twenty-fifth Day of September, 2001

Attest:

NICHOLAS P. GODICI
*Attesting Officer*     *Acting Director of the United States Patent and Trademark Office*